United States Patent [19]
Horie et al.

[11] Patent Number: 5,862,605
[45] Date of Patent: Jan. 26, 1999

[54] VAPORIZER APPARATUS

[75] Inventors: Kuniaki Horie, Yamato; Naoaki Ogure, Tokyo; Yukio Fukunaga; Akihisa Hongo, both of Yokohama, all of Japan

[73] Assignee: Ebara Corporation, Tokyo, Japan

[21] Appl. No.: 862,155

[22] Filed: May 22, 1997

[30] Foreign Application Priority Data

May 24, 1996 [JP] Japan .................................. 8-153407

[51] Int. Cl.$^6$ .................................................. F26B 19/00
[52] U.S. Cl. ........................................ 34/68; 34/77; 34/78
[58] Field of Search .................................. 34/60, 61, 68, 34/73, 76, 77, 78, 79; 392/394, 395, 396, 399, 389; 427/62, 255.1, 255.2, 255.3; 505/447, 473, 730, 734

[56] References Cited

U.S. PATENT DOCUMENTS 5,204,314  4/1993  Kirlin et al. .
5,224,202  6/1993  Arnold et al. .
5,608,974  3/1997  Tanaka et al. ............................. 34/78

FOREIGN PATENT DOCUMENTS 0 498 622  8/1992  European Pat. Off. .

Primary Examiner—Henry Bennett
Assistant Examiner—Steve Gravini
Attorney, Agent, or Firm—Wenderoth, Lind & Ponack, L.L.P.

[57] ABSTRACT

Heat can be supplied effectively to a porous member of a vaporizer apparatus so that a vaporizing operation can be carried out smoothly and efficiently. The vaporizer apparatus includes a vaporizer section having a porous member including a liquid receiving surface and a vapor discharge surface. A feed supply section supplies a liquid feed material to the liquid receiving surface of the porous member. A heating medium passage is in thermal contact with the porous member. A heating medium supply system flows a heating medium of a temperature higher than a vaporization temperature of the liquid feed material through the heating medium passage.

38 Claims, 6 Drawing Sheets

F I G. 4
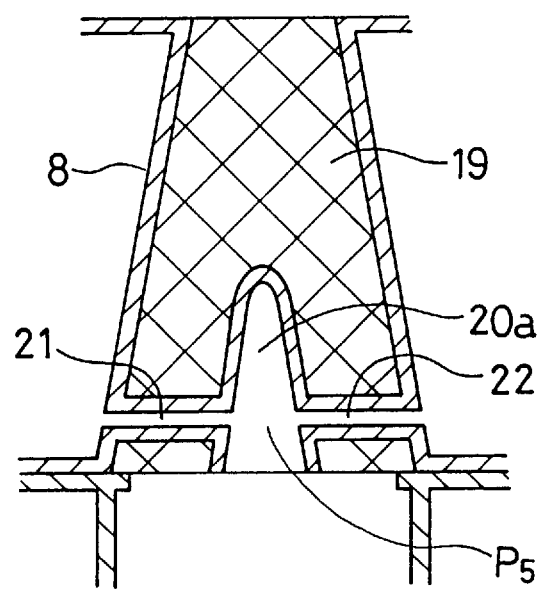

VAPORIZER APPARATUS

BACKGROUND OF THE INVENTION

1. Field of the Invention

This invention relates in general to a vaporizer apparatus which is used, for example, in chemical vapor deposition of thin films from liquid feed material, and relates in particular to a liquid feed vaporizer apparatus for vaporizing such high dielectric thin film forming materials as barium/strontium titanate.

2. Description of the Related Art

In recent years, significant progress has been made in the field of high density integration of semiconductor electronic circuits in anticipation of achieving giga-bit-capacity DRAMs to overtake the currently available mega-bit-capacity DRAMs. For obtaining the high capacity dielectric thin films necessary to produce such DRAM circuits, the currently used dielectric materials such as silicon oxide and silicon nitride films having dielectric constant less than 10 are to be superseded by metallic thin film materials such as tantrum pentaoxide ($Ta_2O_5$) having a dielectric constant in the range of 20, barium titanium oxide ($BaTiO_3$) or strontium titanium oxide (SrTiO3) having a dielectric constant in the range of 300, or barium strontium titanate which is an admixture of the afore-mentioned compounds.

As a method of growing thin films from such materials, chemical vapor deposition (CVD) is favored. In this case, it is necessary that, a gas-phase feed material be supplied steadily on a substrate material held in a reaction chamber. In order to stabilize the vaporization characteristics, the feed gas is derived by heating for vaporization a liquid source produced by dissolving materials such as $Ba(DPM)_2$ or $Sr(DPM)_2$, which are solid at normal temperature, in some organic solvent such as THF.

It is extremely difficult to stably vaporize feed materials of highly dielectric materials described above because: (1) vaporization and decomposition temperatures are close together; (2) a difference exists in the vaporization temperatures between the film material and the organic solvent; and (3) the vapor pressures are all very low. For example, for a liquid feed made by dissolving $Ba(DPM)_2$ or $Sr(DPM)_2$ in THF, the liquid phase of the solvent ranges in the region marked as "a" in FIG. 6, and the liquid or solid phase of the material ranges in "a+c". Therefore, when raising the temperature of the liquid through the region marked "c" to vaporize the liquid feed which is in "a", there is a danger that only the solvent is evaporated, causing the film material to precipitate out and resulting in plugging of the passage or degradation in the feed quality due to compositional changes.

Therefore it is generally considered that, when vaporizing a liquid feed material, it is necessary to rapidly heat the liquid to bring it quickly to the high temperature region. A known type of vaporizer apparatus utilizes a technology of first preparing atomized mist with the use of an ejector nozzle or ultrasonic vibrator, and then heating the mist in a high temperature region to produce a vapor.

However, in the conventional type of vaporizer apparatus presented above, a porous member loses heat due to the heat of vaporization of the liquid feed dispersed therein, and if a local low temperature zone should be created, it may cause a clogging of the porous member. Therefore, it is necessary that a fairly large amount of excess heat be supplied to the porous member. In the conventional vaporizer apparatus, the heat to the porous member is supplied externally, and the center of the porous member is heated primarily by the heat conducted through the porous member itself. Therefore, the supply of heat to the interior of the porous member tends to be insufficient, and consequently the vaporizing efficiency is lowered due to such problems as clogging in the interior of the porous member.

For the type of vaporizing process in which only the lower temperature limit is important, the exterior temperature of the porous member is heated to a sufficiently high temperature so that the interior region of the porous member can reach the required temperature. However, for certain types of liquid feed material, excessive raising of the external temperature may cause a possible decomposition or degradation of the liquid or evaporated feed material. For such materials, the presently employed method cannot be employed because the required range between the upper and lower temperature limits is too narrow.

SUMMARY OF THE INVENTION

The object of this invention is to resolve the problem outlined above so that heat can be supplied effectively to a porous member of a vaporizer apparatus so that the vaporizing operation can be carried out smoothly and efficiently.

The object has been achieved in a vaporizer apparatus comprising: a vaporizer section having a porous member including a liquid receiving surface and a vapor discharge surface; a feed supply section for supplying a liquid feed material to the liquid receiving surface of the porous member; a heating medium passage in thermal contact with the porous member; and a heating medium supply system for flowing a heating medium of a temperature higher than a vaporization temperature of the liquid feed material, through the heating medium passage.

Accordingly, the porous member is heated directly by the heat sufficiently provided by the heating medium flowing through the heating medium passage so that the vaporization process is efficiently conducted by utilizing the entire section of the porous member.

The heating medium passage is usually defined by a suitable casing of a proper material and a dimension such as diameter or thickness so as to construct an independent and closed system against the material passage including the porous member. The heat of vaporization is transferred by conduction from the heating medium through the casing to the porous member.

The heating medium is usually selected from high heat capacity materials such as oil so that temperature variation is minimized and stable temperature control can be achieved. When a heating medium of high heat capacity is used, there is no need to circulate the heating medium at a high flow rate, if the bore of the heating medium passage is of a sufficient size. It is evident that in addition to the heating medium passage, some external source of heat can be utilized to provide heat to the porous member.

The heating medium passage may include an outer heating medium passage which surrounds a side surface of the porous member and/or an inner heating medium passage which passes through the porous member. The inner heating medium passage may include a transverse path which extends in a direction to cross an axis of the porous member and/or a longitudinal passage which extends in a direction parallel to an axis of the porous member and/or a stagnant section which enlarges in a central region of the porous member.

The heating medium passage may be provided so as to surround an edge portion of at least one of the liquid receiving section or the vapor discharge section and/or comprised by a jacket device constructed as split members so as to clamp an edge of the porous member. A second outer heating medium passage may be provided to surround a central part of at least one of the liquid receiving surface or the vapor discharge surface. The porous member may be formed in a columnar shape or a disc shape or may include a cross section which enlarges in a downstream direction. The speed of the vapor produced within the porous member from the feed fluid is determined by the cross sectional area of the fluid passage, and if the velocity is too high, there is a pressure increase at the fluid inlet side. By increasing the size of the downstream region of the porous member, pressure loss can be maintained below a suitable value.

The feed material supply section may be thermally separated from the vaporizer section and is provided with a temperature maintaining device for maintaining a temperature of the liquid feed supply route to a temperature not more than a vaporization temperature of the liquid feed material. It becomes possible to prevent heat transfer from the vaporizer section at a high temperature to the feed material supply route, and furthermore, the temperature maintaining device is able to prevent heating by radiation for example from the vaporizer section. The temperature should be selected to be the lowest temperature of the various temperature elements for the liquid feed material such as vaporization and decomposition temperatures of the components of the liquid feed material. Accordingly, the composition of the feed material can be kept stable until just prior to its entry into the vaporization region.

The feed material supply section may be provided with a pressure adjustment section disposed immediately upstream of the vaporizer section for adjusting a pressure of the liquid feed material. The pressure adjustment section may comprise pressure valves, an orifice or a spring-loaded one-way valve for enabling adjustment of the flow pressure. Accordingly, it becomes possible to maintain the pressure of the liquid feed material to immediately prior to its entering the vaporizer section so as to prevent separation of the most volatile components from the liquid feed material.

The apparatus may be provided with a temperature maintaining device for heating or cooling the pressure adjustment section. The pressure adjustment section has usually a constriction and is particularly vulnerable to clogging. By controlling the temperature in this vulnerable section, it becomes possible to prevent clogging of the section. The temperature maintaining device may perform heating or cooling of the pressure adjustment section by way of a liquid heating medium.

BRIEF DESCRIPTION OF THE DRAWINGS

FIG. 4 is a cross sectional view of main sections of the embodiment shown in FIG. 3.

DESCRIPTION OF THE PREFERRED EMBODIMENTS

Preferred embodiments of the invention will be explained with reference to the drawings.

Figure 1:
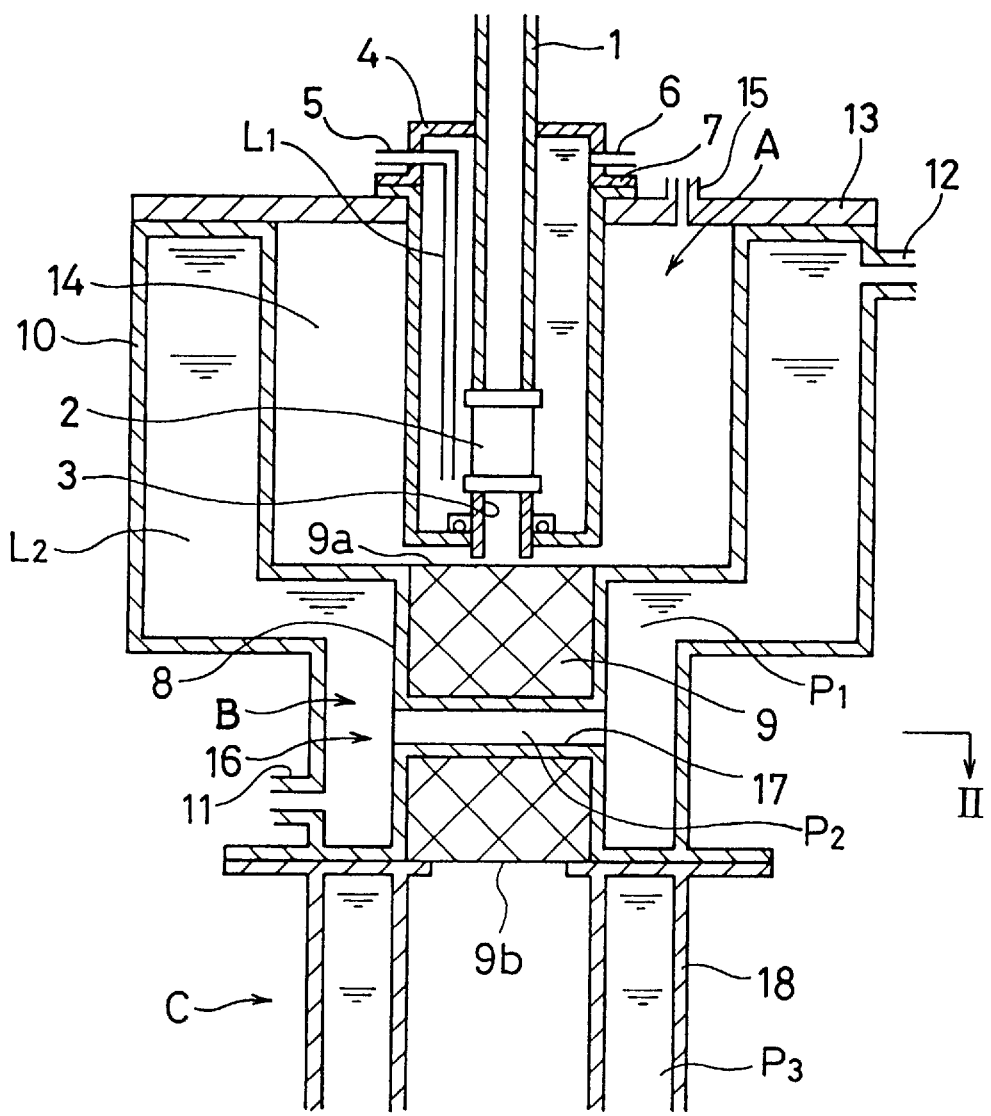
FIG. 1 is a cross sectional view of a first embodiment of the vaporizer apparatus of this invention.

FIGS. 1 and 2 show a first embodiment of this invention comprising, sequentially from the top, a liquid feed supply section A; a vaporizer section B for contacting and heating liquid feed material to be vaporized; and a discharge pipe C for discharging feed gas vaporized by the vaporizer section B to a next processing station.

The liquid supply section A comprises a liquid feed supply pipe 1 which extends through the center region vertically, and the top section of the supply pipe is connected to a feed pipe while the bottom section opens to an upper section of the vaporizer section B. In the vicinity of the bottom section of pipe 1, is a pressure adjustment valve 2 for releasing the feed liquid when the upstream pressure is higher than a given pressure, and a feed material discharge opening (nozzle) 3 downstream of valve 2. A thermal insulation jacket 4 is provided to maintain the temperature of the feed supply pipe 1 including the pressure adjustment valve 2. There are also cooling provisions having an inlet pipe 5 and an outlet pipe 6 for circulating a cooling medium $L_1$ such as water. In this embodiment, the thermal insulation jacket 4 is separable vertically by way of a flange 7 for facilitating maintenance work such as exchanging of the pressure adjustment valve 2. The inlet pipe 5 of the feed supply section A is extended to near the bottom section of the jacket 4 so as to provide smooth circulation of the cooling medium $L_1$ therein.

The vaporizer section B is provided with a porous member 9 inside a cylindrical casing 8 which is surrounded by a jacket heater 10 for defining an outer heating medium passage $P_1$ around the casing 8. The jacket heater 10 is provide with an inlet port 11 and an outlet port 12 for flowing heating medium $L_2$ therethrough. It is desirable to use a liquid heating medium $L_2$ having a large heat capacity, and the usual practice is to use a suitable oil. In this embodiment, the jacket heater 10 extends to thermal insulation jacket 4 surrounding the feed supply pipe 1 located above. These elements, together with a ceiling plate 13, define a space 14 which tightly surrounds the nozzle 3 at the lower end of the feed supply pipe 1.

The ceiling plate 13 is provided with a carrier gas inlet 15 for introducing carrier gas such as Ar into the space 14 for facilitating the vaporization or the substitution of the liquid feed. The lower tip end of the nozzle 3 is placed to maintain a predetermined narrow gap between the upper surface (liquid receiving surface) 9a of porous member 9, so that even a small amount of liquid feed is smoothly delivered to the porous member 9.

The porous member 9 is made of a thermally conductive material and is formed into a porous member having a specific void content so as to generate a suitable liquid and gas permeability. For example, the porous member may be made of a solid material in the form of powder, particulate, wire, aciculate, fiber or other irregular shaped pieces which are packed into a gas permeable container, or it may also be made by pressing or heating solid material into a porous member or mesh form. It is desirable that the diameter of void in the porous member be in a range of several tens of micrometers to 100 $\mu$m. It is also permissible to make a porous member from a non-porous material member by forming fine slits or holes therein. The solid material is usually a metal, but other materials having suitable thermal resistance and conductivity such as ceramic and plastic materials may also be used.

Figure 2A:
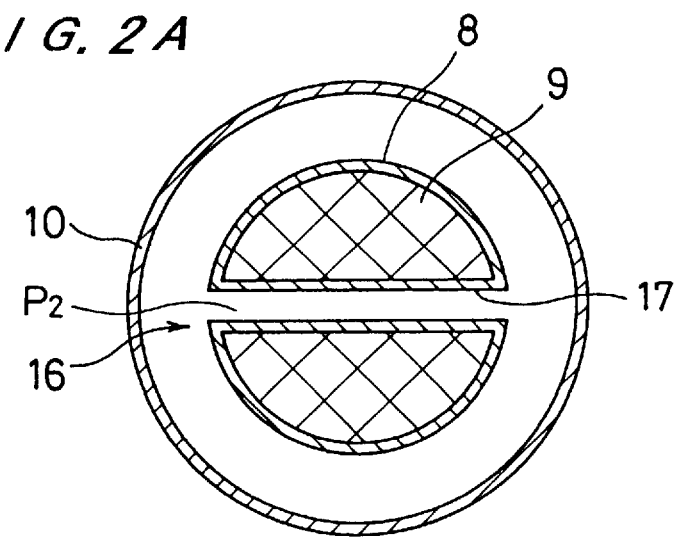
FIG. 2A is a cross-sectional view of a porous member of FIG. 1 taken along line II thereof.

As illustrated in FIG. 2(a), there is a horizontal through hole 16 in the vertically middle section of the porous member 9, and at a position corresponding with the through hole 16 a through pipe 17 is provided on the cylindrical casing 8 for defining an inner heating medium passage $P_2$. The lower surface (vapor discharge surface) 9b of the porous member 9 opens to the discharge pipe C connected to the lower section of the vaporizer section B, which is also provided with jacket 18 defining another outer heating medium passage $P_3$ to maintain the temperature of the porous member 9 and the exhausted feed material gas above its vaporization temperature.

The feed material supply pipe 1 is connected to a feed material supply source having a flow rate controller and a pump to supply the feed at a given rate and pressure. The discharge pipe C is connected, for example, to a vacuum chamber for carrying out a CVD process, and consequently, the internal pressure is fairly low. The thermal insulation jacket 4 of the feed material supply pipe 1 is maintained at a temperature below the vaporization temperature of the liquid feed material by circulating coolant such as cold water therein, and the outer and inner heating medium passages $P_1$, $P_2$, $P_3$ within the jackets 10, 18 are maintained above the vaporization temperature by circulating hot oil.

When the pressure of the liquid feed material increases beyond a certain value set by pressure adjustment valve 2 by the operation of the pump provided in the feed material supply source, the pressure adjustment valve 2 opens, and the liquid feed material is supplied to the upper surface of the vaporizer section B. The supplied liquid feed contacts the upper surface 9a of the porous member 9 to be absorbed into the bulk of the porous member 9 by such effects generated by the lower pressure in the lower section and capillary action, and is vaporized by gaining the heat of vaporization while flowing through the porous member 9. In this embodiment, the liquid feed material transfers instantly from the supply section A, which is at a low temperature, to the vaporizer section B, which is at a high temperature, and therefore a temperature transition region is virtually eliminated. It follows then that such undesirable events as separation of solvent from the feed material and precipitation of constituents from the feed material are effectively prevented.

Figure 2B:
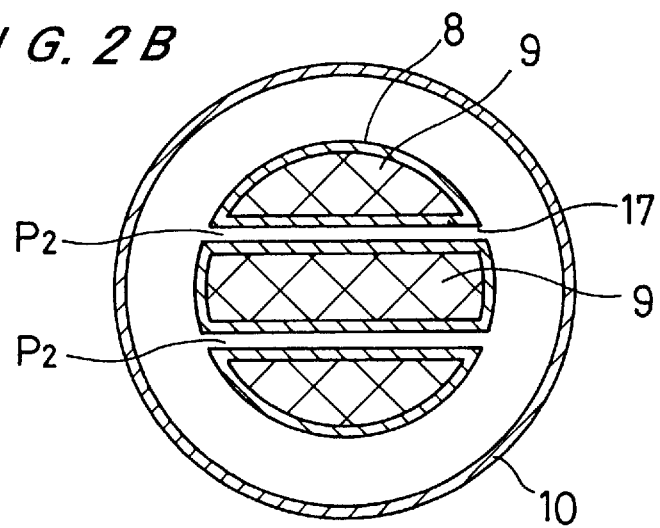
FIG. 2B is a cross-sectional view of a porous member of another embodiment taken along line II.

In this embodiment, because the heated medium passage $P_2$ is disposed so as to pass through the center section of the porous member 9, the heat is supplied effectively to the interior of the porous member 9 which has experienced a lowering of temperature due to the absorption of the heat of vaporization by the infiltrating liquid feed material. Thus even in the interior of the porous member 9, non-uniformity in temperature distribution is kept low. Therefore, the vaporization efficiency is improved by utilizing the entire region of the porous member 9. It is obvious that a plurality of heating medium passages $P_2$ passing through the porous member 9 may be provided as illustrated in FIG. 2(b).

Figure 3:
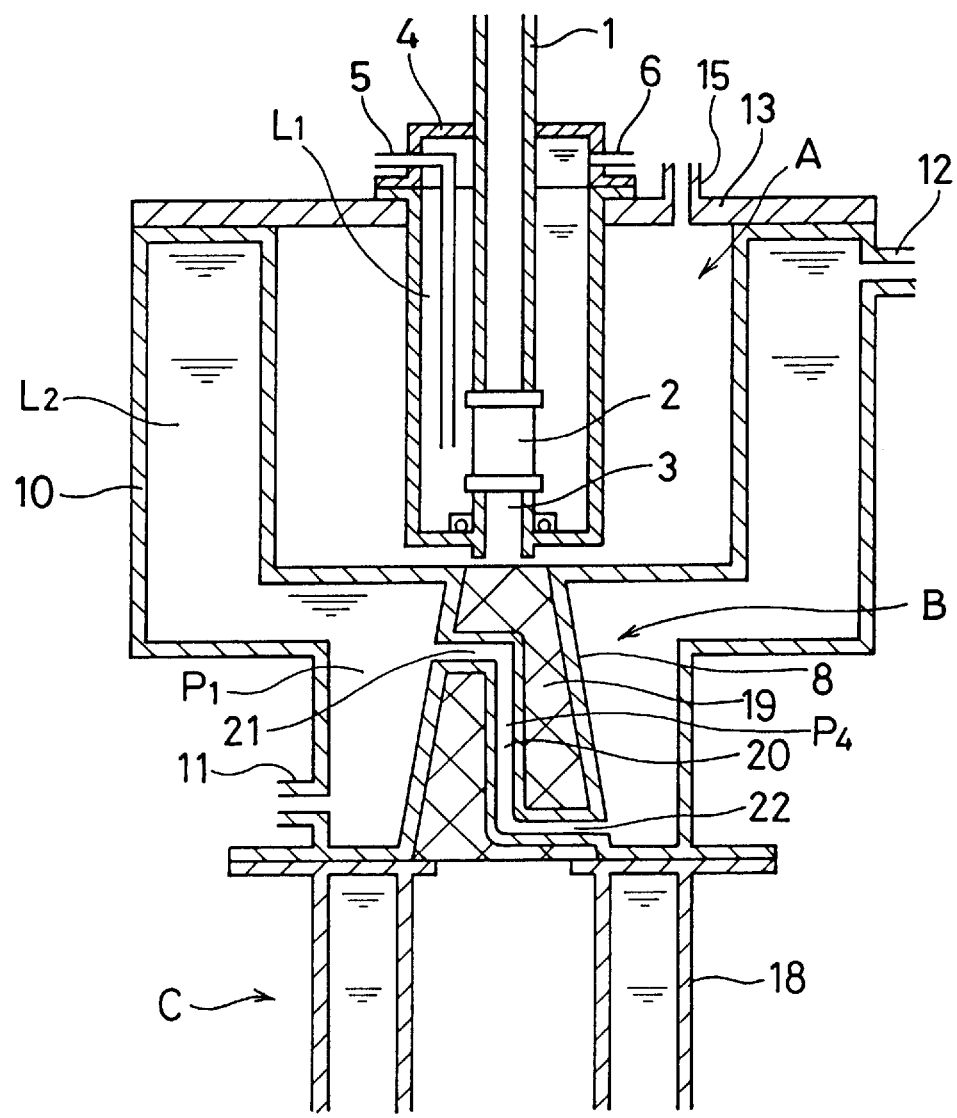
FIG. 3 is a cross sectional view of another embodiment of the vaporizer apparatus according to the invention.

Another embodiment is shown in FIG. 3, in which porous member 19 is tapered so as to be progressively wider towards the bottom thereof. The larger downstream radius is meant to prevent an increase in pressure loss at the inlet side caused by an increasing downstream vapor velocity as the vaporization process progresses. In this case, to produce a temperature uniformity between the interior and exterior sections in the enlarged section, an inner heating medium passage $P_4$ in the lower center section of the porous member 19 is provided.

In this embodiment, the inner heating medium passage $P_4$ is formed to have a vertical path 20 and transverse paths 21, 22 provided upstream and downstream thereof. However, as shown in FIG. 4, it is permissible to provide an inlet passage $P_5$ having transverse paths 21, 22 at the same height. In such a case, the vertical path 20a is formed to have wider sectional areas than the transverse paths 21, 22, and heating medium circulates by convection within the vertical path 20a.

Figure 5:
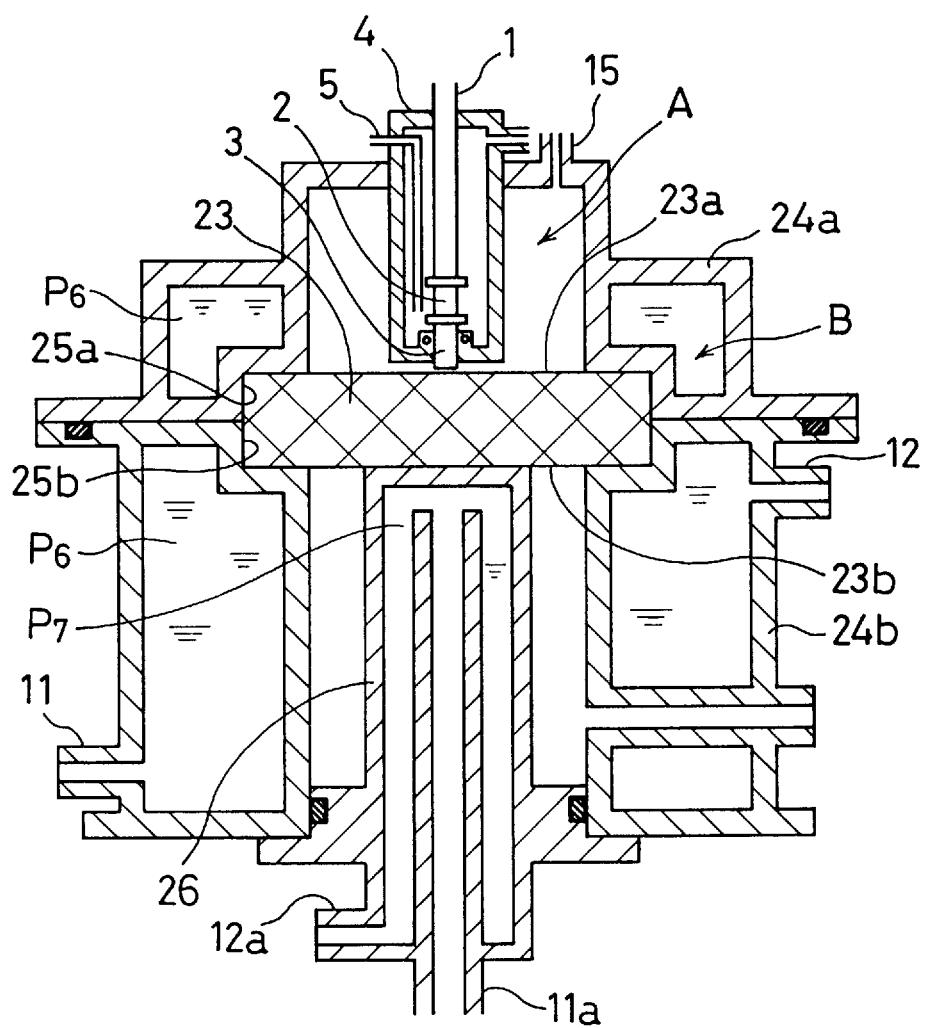
FIG. 5 is a cross sectional view of main sections of another embodiment of the vaporizer apparatus according to the invention.
Figure 6:
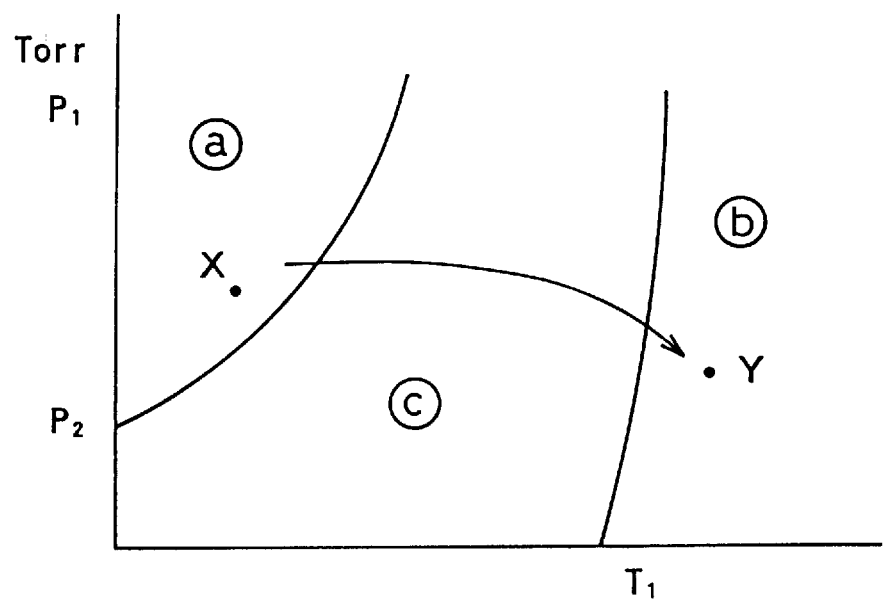
FIG. 6 is a graph showing properties of a liquid feed material.

FIG. 5 shows another embodiment of the present invention, in which porous member 23 is a disc in comparison to the pervious embodiments. This porous member 23 does not have any inner heating medium passage, but instead split jacket members 24a, 24b are in contact with side surfaces as well as outer peripheries of top and bottom surfaces 23a, 23b of the porous member 23 for constituting a first outer heating medium passage $P_6$. The jacket members 24a, 24b are constructed so that ring-shaped depression sections 25a, 25b thereof receive and clamp the peripheral edge of the porous member 23. Another jacket device 26, defining a second outer heating medium passage $P_7$, protrudes from the center of the discharge pipe C so that its top surface contacts the center section of the vapor discharge surface 23b.

In the vaporizer of such a construction, the liquid feed material is supplied from the nozzle 3 to the center of the liquid receiving surface 23a of the porous member 23, and flows radially in the interior of the porous member 23, due to the effects of negative pressure below and capillary action, and vaporizes on the way by gaining the heat of vaporization. The vaporized gas flows from the annular vapor discharge surface 23b into the discharge pipe C to be supplied to the next step in the process. Because the porous member 23 is a disc, it can be heated sufficiently by heat supplied from the edge section and the bottom surfaces so that stable vaporization can be achieved without plugging. The shape is simple and the manufacturing cost is low. Also, in this embodiment, because the external jacket devices 24a, 24b are split into vertical members to fix the porous member 23 therebetween, they can easily be detached from the porous member 23 for cleaning and replacement thereof.

As explained above, according to this invention, the porous member is heated from its core by the heating medium flowing in the passage so as to promote vaporization from the interior of the porous member, thereby producing highly efficient vaporizer action by enabling utilization of the entire area of the porous member. Furthermore, by providing a feed material supply section separate from the vaporizer section and providing a temperature maintaining device for maintaining a temperature of the feed material supply route to a given temperature, it is possible to prevent the conduction of heat from the vaporizer section at a high temperature to the feed material supply section at a lower temperature, thereby enabling efficient operation of the vaporizer apparatus. Further, by providing a pressure adjustment valve directly upstream of the vaporizer section to adjust the internal pressure of the liquid feed material, it is possible to prevent degradation of the liquid feed before reaching the vaporizer section. The overall result of such improvement is that a liquid feed material having a complex set of properties may be processed effectively and efficiently in the vaporizer apparatus of this invention.

What is claimed is:

1. A vaporizer apparatus for vaporizing a liquid, said apparatus comprising:
   a vaporizer section including a porous member having a liquid receiving surface, a vapor discharge surface and voids communicating with said liquid receiving surface and said vapor discharge surface;

a feed supply section for supplying liquid feed material to be vaporized to said liquid receiving surface of said porous member;

a heating medium passage that is independent and separate from said voids of said porous member and that is in thermal contact with said porous member; and a heating medium supply system for flowing through said heating medium passage a heating medium at a temperature higher than a vaporization temperature of the liquid feed material.

2. An apparatus as claimed in claim 1, wherein said feed supply section is located above said vaporizer section.

3. An apparatus as claimed in claim 1, wherein said heating medium passage includes an outer heating medium passage surrounding a side surface of said porous member.

4. An apparatus as claimed in claim 3, wherein said outer heating medium passage is defined by a jacket device constructed as split members that are operable to clamp an edge portion of said porous member.

5. An apparatus as claimed in claim 3, further comprising an outer second heating medium passage surrounding a central portion of at least one of said liquid receiving surface and said vapor discharge surface.

6. An apparatus as claimed in claim 1, wherein said heating medium passage includes an inner heating medium passage extending through said porous member.

7. An apparatus as claimed in claim 6, wherein said inner heating medium passage includes a transverse portion extending in a direction crossing an axis of said porous member.

8. An apparatus as claimed in claim 6, wherein said inner heating medium passage includes a longitudinal portion extending in a direction parallel to an axis of said porous member.

9. An apparatus as claimed in claim 6, wherein said inner heating medium passage includes a stagnant portion that enlarges into a central region of said porous member.

10. An apparatus as claimed in claim 1, wherein said heating medium passage surrounds an edge portion of at least one of said liquid receiving surface or said vapor discharge surface of said porous member.

11. An apparatus as claimed in claim 1, wherein said porous member has a columnar shape.

12. An apparatus as claimed in claim 1, wherein said porous member is disc-shaped.

13. An apparatus as claimed in claim 1, wherein said porous member has a cross section that enlarges in a downstream direction of said apparatus.

14. An apparatus as claimed in claim 1, further comprising a carrier gas supply passage for supplying a carrier gas toward said liquid receiving surface.

15. An apparatus as claimed in claim 1, wherein said feed material supply section is thermally separated from said vaporizer section and includes a temperature regulation device to maintain said heating medium passage at a temperature not exceeding a vaporization temperature of the liquid feed material.

16. An apparatus as claimed in claim 1, wherein said feed supply section includes a pressure regulation section for adjusting a pressure of the liquid feed material, said pressure regulation section being positioned upstream of said vaporizer section.

17. An apparatus as claimed in claim 16, wherein said pressure regulation section includes a temperature regulation device to heat or cool said pressure regulation section.

18. An apparatus as claimed in claim 17, wherein said temperature regulation device is operable to utilize a fluid thermal transfer medium to achieve heating or cooling.

19. An apparatus as claimed in claim 17, wherein said temperature regulation device is operable to maintain said pressure regulation section at a temperature not exceeding a vaporization temperature of the liquid feed material.

20. A vaporizer apparatus to be employed in a CVD system for vaporizing a liquid to form a vapor to be supplied to a deposition chamber of the CVD system, said vaporizer apparatus comprising:

a vaporizer section including a porous member having a liquid receiving surface, a vapor discharge surface and voids communicating with said liquid receiving surface and said vapor discharge surface;

a feed supply section for supplying liquid feed material to be vaporized to said liquid receiving surface of said porous member;

a heating medium passage that is independent and separate from said voids of said porous member and that is in thermal contact with said porous member; and a heating medium supply system for flowing through said heating medium passage a heating medium at a temperature higher than a vaporization temperature of the liquid feed material.

21. An apparatus as claimed in claim 20, wherein said feed supply section is located above said vaporizer section.

22. An apparatus as claimed in claim 20, wherein said heating medium passage includes an outer heating medium passage surrounding a side surface of said porous member.

23. An apparatus as claimed in claim 22, wherein said outer heating medium passage is defined by a jacket device constructed as split members that are operable to clamp an edge portion of said porous member.

24. An apparatus as claimed in claim 22, further comprising an outer second heating medium passage surrounding a central portion of at least one of said liquid receiving surface and said vapor discharge surface.

25. An apparatus as claimed in claim 20, wherein said heating medium passage includes an inner heating medium passage extending through said porous member.

26. An apparatus as claimed in claim 25, wherein said inner heating medium passage includes a transverse portion extending in a direction crossing an axis of said porous member.

27. An apparatus as claimed in claim 25, wherein said inner heating medium passage includes a longitudinal portion extending in a direction parallel to an axis of said porous member.

28. An apparatus as claimed in claim 25, wherein said inner heating medium passage includes a stagnant portion that enlarges into a central region of said porous member.

29. An apparatus as claimed in claim 20, wherein said heating medium passage surrounds an edge portion of at least one of said liquid receiving surface or said vapor discharge surface of said porous member.

30. An apparatus as claimed in claim 20, wherein said porous member has a columnar shape.

31. An apparatus as claimed in claim 20, wherein said porous member is disc-shaped.

32. An apparatus as claimed in claim 20, wherein said porous member has a cross section that enlarges in a downstream direction of said apparatus.

33. An apparatus as claimed in claim 20, further comprising a carrier gas supply passage for supplying a carrier gas toward said liquid receiving surface.

34. An apparatus as claimed in claim 20, wherein said feed material supply section is thermally separated from said vaporizer section and includes a temperature regulation device to maintain said heating medium passage at a temperature not exceeding a vaporization temperature of the liquid feed material.

35. An apparatus as claimed in claim 20, wherein said feed supply section includes a pressure regulation section for adjusting a pressure of the liquid feed material, said pressure regulation section being positioned upstream of said vaporizer section.

36. An apparatus as claimed in claim 35, wherein said pressure regulation section includes a temperature regulation device to heat or cool said pressure regulation section.

37. An apparatus as claimed in claim 36, wherein said temperature regulation device is operable to utilize a fluid thermal transfer medium to achieve heating or cooling.

38. An apparatus as claimed in claim 36, wherein said temperature regulation device is operable to maintain said pressure regulation section at a temperature not exceeding a vaporization temperature of the liquid feed material.

* * * * *